US009787324B2

(12) United States Patent
Han

(10) Patent No.: US 9,787,324 B2
(45) Date of Patent: Oct. 10, 2017

(54) MULTI-TOUCH SENSING LIGHT EMITTING DIODE DISPLAY AND METHOD FOR USING THE SAME

(75) Inventor: Jefferson Y. Han, Holliswood, NY (US)

(73) Assignee: New York University, New York, NY (US)

( * ) Notice: Subject to any disclaimer, the term of this patent is extended or adjusted under 35 U.S.C. 154(b) by 1623 days.

(21) Appl. No.: 12/573,079

(22) Filed: Oct. 2, 2009

(65) Prior Publication Data

US 2010/0020040 A1  Jan. 28, 2010

Related U.S. Application Data

(63) Continuation of application No. 11/257,927, filed on Oct. 24, 2005, now Pat. No. 7,598,949.

(60) Provisional application No. 60/621,379, filed on Oct. 22, 2004.

(51) Int. Cl.
*G06M 7/00* (2006.01)
*H03M 11/26* (2006.01)
*G06F 3/042* (2006.01)
*H03K 17/96* (2006.01)

(52) U.S. Cl.
CPC .......... *H03M 11/26* (2013.01); *G06F 3/0421* (2013.01); *H03K 17/9629* (2013.01); *H03K 17/9631* (2013.01)

(58) Field of Classification Search
CPC ..... G06F 9/467; G06F 11/073; G06F 11/0793
USPC .............. 345/173, 176, 178, 156, 175, 506; 178/18.01, 18.11; 313/506
See application file for complete search history.

(56) References Cited

U.S. PATENT DOCUMENTS

| | | | |
|---|---|---|---|
| 3,621,268 A | 11/1971 | Friedrich | |
| 4,424,524 A * | 1/1984 | Daniele | H04N 1/024 347/130 |
| 4,484,179 A * | 11/1984 | Kasday | G01L 1/247 178/18.01 |
| 4,684,801 A * | 8/1987 | Carroll | G01V 8/20 250/221 |
| 4,692,739 A | 9/1987 | Dorn | |
| 4,986,662 A * | 1/1991 | Bures | G06F 3/0421 250/221 |
| 5,237,314 A * | 8/1993 | Knapp | G09G 3/3685 345/84 |
| 5,424,855 A * | 6/1995 | Nakamura | H04N 1/024 250/208.1 |
| 5,942,761 A * | 8/1999 | Tuli | G06K 7/10722 250/556 |

(Continued)

OTHER PUBLICATIONS

Office Action U.S. Appl. No. 11/257,924 mailed Nov. 19, 2008.

*Primary Examiner* — Olga Merkoulova
(74) *Attorney, Agent, or Firm* — Andrews Kurth Kenyon LLP

(57) ABSTRACT

Apparatus and method for both displaying graphical output and for sensing, e.g., multi-touch input are provided. A light-emitting diode ("LED") matrix-array may be configured to both emit and sense light. The array may be driven in such a way so as to enable the array itself to act as the illumination source preferable for either reflective or scattering optical touch sensing. The need for additional optoelectronic components, or an external illumination source, is thus eliminated or at least reduced. Additionally, the matrix-arrays have large dimensions.

59 Claims, 8 Drawing Sheets

(56) References Cited

U.S. PATENT DOCUMENTS

| | | |
|---|---|---|
| 6,787,810 B2 | 9/2004 | Choi et al. |
| 6,864,882 B2* | 3/2005 | Newton ........................ 345/173 |
| 7,042,444 B2 | 5/2006 | Cok |
| 2004/0101851 A1* | 5/2004 | White ...................... C12Q 1/68 |
| | | 435/6.19 |
| 2004/0140960 A1* | 7/2004 | Cok ............................. 345/175 |
| 2004/0246105 A1* | 12/2004 | Cavallucci ........... H03K 17/943 |
| | | 340/286.01 |
| 2005/0146512 A1* | 7/2005 | Hill et al. ...................... 345/173 |
| 2006/0152740 A1* | 7/2006 | Cavallucci ............ G06F 3/0421 |
| | | 356/614 |
| 2010/0020040 A1* | 1/2010 | Han ...................... G06F 3/0421 |
| | | 345/173 |

* cited by examiner

MULTI-TOUCH SENSING LIGHT EMITTING DIODE DISPLAY AND METHOD FOR USING THE SAME

CROSS-REFERENCE TO RELATED APPLICATION(S)

This application is a continuation of U.S. application Ser. No. 11/257,924, filed Oct. 24, 2005, now U.S. Pat. No. 7,598,949 and claims priority from U.S. Patent Application No. 60/621,379, filed on Oct. 22, 2004, the entire disclosure of which is incorporated herein by reference.

FIELD OF THE INVENTION

The present invention relates generally to light emitting diode ("LED") display devices, and more particularly to LED displays that are touch-input enabled, and methods for using the same.

BACKGROUND INFORMATION

Light emitting diodes ("LEDs") are compact inexpensive solid-state devices which produce light when a suitable electric current is applied. They are extensively used as display indicators for electronic and computing devices. They are also widely used in large arrays to display graphics and text information in raster form.

Operating an array of LEDs to display graphical data is typically performed by connecting them in a passive-matrix configuration and driving them column by column in a time-multiplexed manner. During each column-scan period, row drivers are selectively enabled or disabled, causing the LEDs at those row/column intersections to emit light, in accordance with the desired image output. This column-scan process occurs rapidly enough, so that the individual LED emission pulses appear continuous, and the image is coherent. This arrangement and method reduces complexity and drive electronics enough to make arrays of a useful size at all practical.

Most LEDs can also operate as photodiodes, or light detectors, as well. Though they typically designed for only their emitting, and not their detecting role, most can function effectively in either role.

The use of LEDs in a bidirectional manner is known, e.g., in LED copier/scanner heads, as described in U.S. Pat. No. 4,424,524 to Daniele, and U.S. Pat. No. 5,424,855 to Nakamura.

Furthermore, it is possible to utilize the same set of LEDs for both display and sensing purposes simultaneously, by rapidly multiplexing these functions in time. This is possible without sacrificing the display capabilities, if the sensing is done fast enough to be beyond the scope of human perception.

U.S. Pat. No. 4,692,739 to Dorn describes the use of LEDs in this manner to create a touch sensing display. The features described in this publication include an LED array that has been configured for simultaneously emitting and detecting light, and registers touches by detecting the attenuation of background illumination when a finger covers one or more LEDs. However, this occlusion-based approach may be prone to false triggering by shadows. It also may require the presence of a stable external illumination source. Finally it does not apply to passive-matrix configurations, and hence is not scalable in practice to large arrays.

Touch sensing mechanisms have also been described that operate by employing active emitter/detector pairs, and sensing fingers and objects through the reflection of light, as described in U.S. Pat. No. 3,621,268 to Friedrich. However, this approach likely needs the addition of a large number of dedicated photo-detectors, resulting in increased cost and complexity in component layout and in wiring. Furthermore, such arrangement may still be prone to false triggers due to external illumination.

OBJECTS AND SUMMARY OF THE INVENTION

It is one of the objects of the present invention to improve the accuracy of a touch sensor of the kind that uses an LED array in a bidirectional manner.

Another one of the objects of the present invention is to eliminate the need for any additional illumination, external or internal, for a sensor of this kind.

Still another object of the present invention is to eliminate the need for any additional opto-electronic elements for a sensor of this kind.

Still another object of the present invention is to be scalable in practice to large implementations.

An exemplary embodiment of the present invention utilizes a matrix array of LEDs equipped with both the constant-current drivers necessary to drive them to emit light, and with the appropriate sense-amplifiers necessary to measure flux levels photodiodes. These drivers and amplifiers may be configured in parallel, so that each LED within a column can be dynamically configured to be driven or sensed.

Conventionally, touch sensing of the screen can be performed with such LED array by detecting the occlusion of light. However, optical touch sensing can also be accomplished by reflection or scattering. While touch sensing by occlusion requires illumination from behind the subject (from the point of view of the sensor), the other two techniques require the subject to be illuminated from the front.

An exemplary embodiment of the present invention can be provided which operates the LED display in such a way as to enable the array itself to act as the illumination source necessary for reflective or scattering optical touch sensing.

In a display array that consists of discrete, individually mounted LEDs, the exemplary embodiment of the method according to the present invention may provide alternate LEDs within a column are operated as emitters, while the remaining LEDs are operated as detectors. Light from the emitting elements may be potentially reflected or scattered by the presence of a finger, and is subsequently received and registered by the detecting elements. To cover all the elements in the column, an exemplary procedure according to the present invention may be performed again with the emitting/sensing roles of the LEDs interchanged.

When the array consists of multi-chip LEDs with individually addressable electrodes, as can be the case in multi-color displays, the illumination provided for touch sensing can also be generated by operating, e.g., only one of the chips within each LED package as an emitter, while an alternate chip operates as a detector. In this exemplary configuration according to one exemplary embodiment of the present invention, the spatial interleaving of LED function may not be needed, and both lighting and sensing can be performed at all pixels simultaneously.

As the next exemplary step, all elements can be operated as detectors, and a photometric measurement is taken at all points without any additional illumination supplied. In this manner, the device can obtain, for each element, two photometric readings, one with active illumination, and one without. Control logic thresholds both readings with established ranges, and determines at each pixel whether a finger is in contact.

Because the illumination used for active optical sensing can come from the LED array itself, the need for any additional or ambient light source is eliminated or at least reduced. Also, because the light sought for sensing purposes comes from only the device itself, the signal thresholds used for resolving the presence of a finger can be much more narrowly defined, thus producing more accurate results. Because the light emitted during the scan process is spatially localized to the area being actively sensed, sensing accuracy is again improved.

Because the LEDs themselves are used as the photodetecting element, no additional opto-electronic components are necessary.

Because a sense-amplifier is required only for each row in the matrix, the invention is feasible for larger scales.

The exemplary process of touch sensing can thus be driven very quickly, and performed such that momentary lighting and blanking of LEDs is negligibly perceptible.

Accordingly, an exemplary embodiment of an apparatus according to the present invention is provided. This exemplary apparatus can be provided for displaying graphical data and simultaneously (e.g., multiple) sensing touch information. The apparatus may include a plurality of light emitting diodes ("LEDs") arranged in a matrix-array as at least one column and/or at least one row. The apparatus may also have a first arrangement configured to operate at least one first individual one of the LEDs within the column(s)/row(s) to emit light, and a second arrangement configured to, approximately simultaneously with the operation of the first arrangement, operate second individual ones of the LEDs within the column(s)/row(s) to detect the light. The LEDs may be organic LEDs and/or individually addressable multi-chip LEDs.

The first arrangement and/or the second arrangement may be configured to operate at least one individual chip within the respective one of the LEDs. At least one of the emitting chips can have an emissive wavelength which is at most the same as a wavelength of a respective detecting chip. The first arrangement and/or the second arrangement are capable of generating an illumination from a subset of the LEDs, and wherein the second arrangement is configured to measure the light from the illumination which is reflected and/or scattered back. The subset may include every second one of the LEDs in a scan row of the columns and/or a scan column of the rows, and the detected subset may include the remaining ones of the LEDs.

The LED can have emitter/detector roles which are interchangeable, and the first arrangement and/or the second arrangement measure(s) light responses of the LEDs from which the light is detected. All of the LEDs may be operated as detectors; and the first arrangement and/or the second arrangement can measure light responses of the LEDs that are without an illumination.

Figure 1:
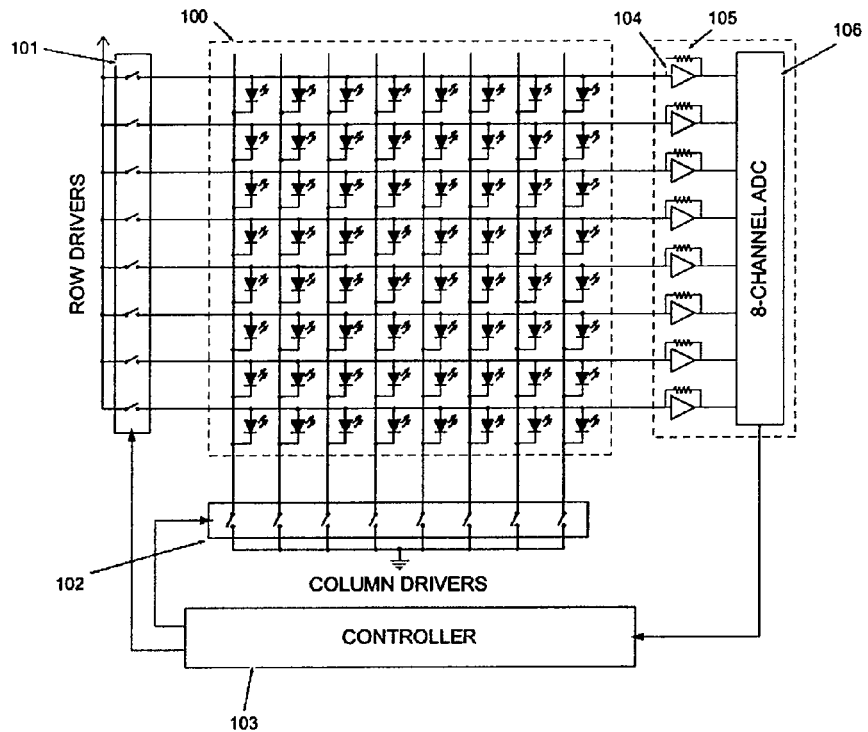
FIG. 1 is a schematic diagram of an exemplary embodiment of an apparatus according to the present invention where a display matrix is composed of individual LEDs.

Throughout the figures, the same reference numerals and characters, unless otherwise stated, are used to denote like features, elements, components or portions of the illustrated embodiments. Moreover, while the present invention will now be described in detail with reference to the figures, it is done so in connection with the illustrative embodiments.

DETAILED DESCRIPTION

Exemplary embodiments of the present invention will be described with reference to the attached drawings. These drawings illustrate the invention but do not restrict its scope, which should be determined solely from the appended claims.

For example, FIG. 1 shows an exemplary embodiment of an arrangement according to the present invention which includes an array of individual LEDs 100 that are connected in a matrix row/column configuration as is typical for arrays designed for display purposes. For example, all LED anodes for a given row are connected together to constant-current unipolar row source drivers 101. Similarly, the cathodes for all the LEDs in a given column are connected together to unipolar column sink drivers 102. These drivers can be MOSFETs. Under the control of a controller 103, the array 100 can display graphical information by sequentially enabling each of the column drivers in turn, while row drivers can be enabled or disabled according to the desired output image.

In addition to the row drivers, each row can also be equipped with a row sense-amplifier, thus forming a series of amplifiers. The amplifier may allow the output from an LED to be acquired when it is operating as a photodiode. For example, the arrangement of FIG. 1 can include a current-to-voltage (I-V) converter stage (e.g., an FET-input operational amplifier 104 with a negative feedback resistor 105), also known as a transimpedance amplifier. The voltage outputs from the I-V converters can be directed into a multiple-channel analog-digital converter (ADC) 106. The ADC can supply digital values for any channel to the controller 103.

When the controller 103 completes a full column scan of the array for the purposes of displaying output, the controller 103 may then performs a different scanning procedure for an exemplary touch sensing functionality.

Figures 3, 4:
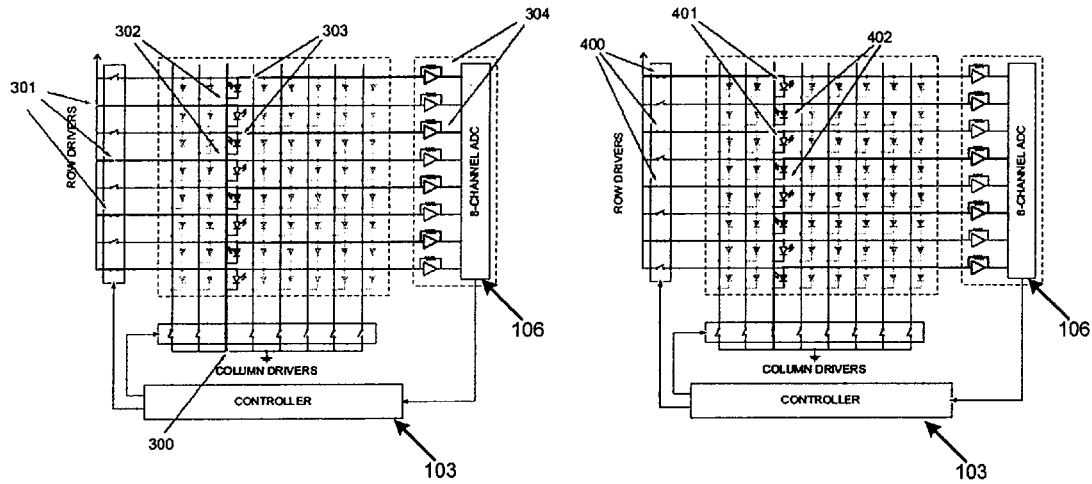
FIG. 3 is a schematic diagram of the apparatus according to one exemplary embodiment of the present invention during a sensing scan sequence, where even row-drivers are enabled, and signal paths are highlighted.
FIG. 4 is a schematic diagram of the apparatus according to one exemplary embodiment of the present invention during a sensing scan sequence, where odd row-drivers are enabled, and signal paths are highlighted.

The scanning procedure may be performed sequentially, e.g., one column at a time. Referring to FIG. 3, a single column-driver 300 can be enabled, while the even-numbered row-drivers 301 may be enabled. This causes the even-numbered LEDs 301 in the column 302 to act as emitters, and produce light. The odd-numbered LEDs in the column 303 however do not produce light to be instead utilized as detectors, and complete circuits through the respective row's sense-amplifier 304.

Figure 6:
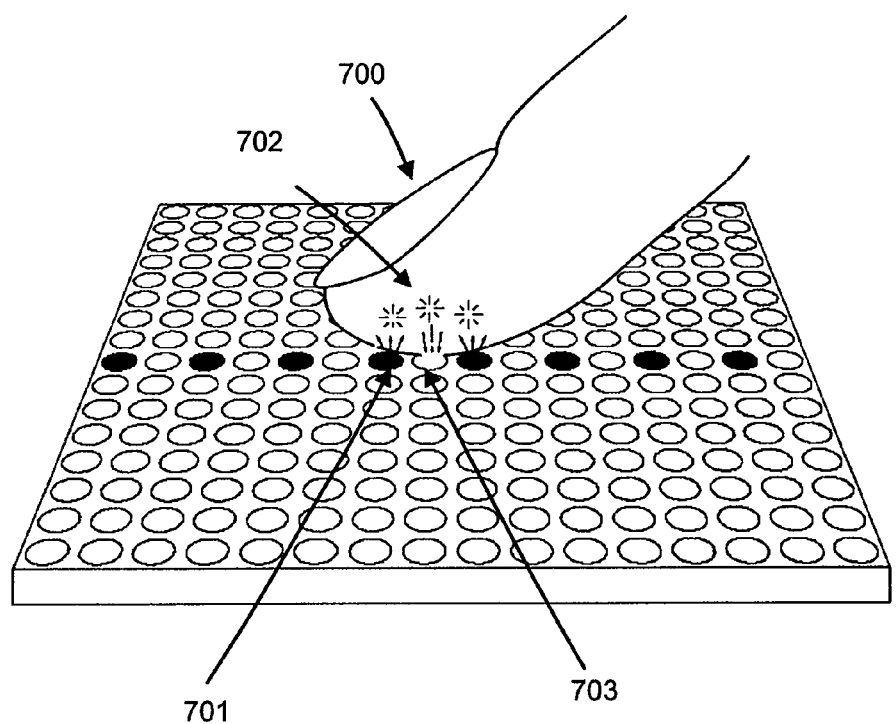
FIG. 6 is a pictorial diagram illustrating the overall touch sensing function using an exemplary embodiment of the present invention.
Figure 7:
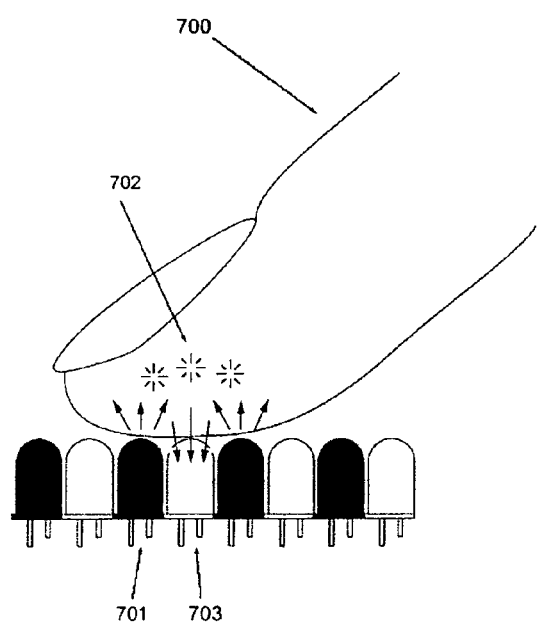
FIG. 7 is a detailed pictorial diagram illustrating a finger being sensed, through the light from an emitting LED entering the finger, being scattered within the finger, and exiting at a sensing LED using the exemplary embodiment of the apparatus according to the present invention.
Figure 9:
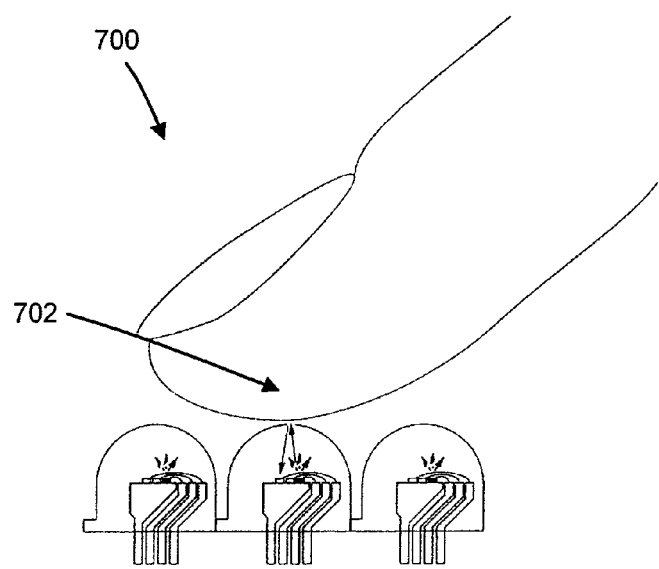
FIG. 9 is a detailed pictorial diagram illustrating the light paths involved when a finger is being sensed by a multi-chip LED according to the present invention.

As shown in FIGS. 6, 7 and 9, if a finger 700 is in contact with the column, light may enter the fingers at points of contact with certain emitting elements 701, which subsequently gets scattered about within an inside portion 702 of the finger 700, and which finally may exit at points of contact with the detecting elements of the column 703.

After a short delay (e.g., a microsecond) to allow the amplifiers values to settle, the ADC 106 can perform a conversion for each odd-numbered input channel, and the results are stored by the controller 103 into its memory. The signals from the even-numbered sense-amplifiers can be ignored. Referring to FIG. 4, the exemplary process can then be repeated for this column with the emitters and detector roles exchanged. For example, the odd-numbered row-drivers 400 may be enabled, while the even-numbered row-drivers can be disabled. This may cause the odd-numbered LEDs in the column 401 to light, and allow the even-numbered LEDs 402 to act as detectors. After a short delay, the ADC 106 performs a conversion for each even-numbered channel input, and the values are stored into memory of the controller 103.

Figure 5:
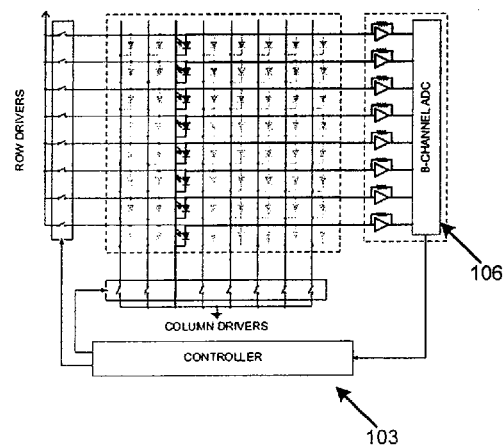
FIG. 5 is a schematic diagram of the apparatus according to one exemplary embodiment of the present invention during a sensing scan sequence, where all row-drivers are disabled, and signal paths are highlighted.

Referring to FIG. 5, the row-drivers can be disabled for all rows, and all LEDs in the column may be utilized as detectors. After another short delay, a further set of conversions by the ADC 106 for all channel-inputs is performed and stored. The column-driver for the column is finally disabled. The above-described exemplary procedure is then repeated for the next column until it has been executed on all columns in the array. The total time to execute this sensing sequence may be so short in duration that users will not perceive these LED strobes as anything but a small increase in the display's black level, if at all. Furthermore, the sense sequence does not have to be executed after every display scan.

For example, when all columns have been scanned in this manner, the controller 103 acquired photometric information for every element in the array under two conditions—while neighboring LEDs are lit, and dark. The controller 103 determines or computes whether touch has occurred for each element by examining these values. If the light levels for both the lit and dark conditions each fall within their respective predetermined ranges, a touch may be registered. Appropriate values for these ranges can be determined in an initial calibration process which executes the sensing sequence, and monitors the raw photometric values acquired.

The exemplary device according to the present invention may be optimized to detect scattering by a finger, but if desired the threshold values can also be made to trigger based on other modes of operation, such as by reflection. This may be preferable if the LED emission is of a wavelength that does not appreciably penetrate a finger. In order for this exemplary device to be able to sense touch, the distance between LEDs in the array should be shorter than half of the minimum feature size to be detected. For an individual finger tip, 6 mm pitch packing of the common T-1¾ LED package is sufficient.

Multi-Chip Exemplary Embodiment

LEDs also can be manufactured so that several chips are tightly contained within a single package, while having separate electrodes, so that each chip is individually electrically controllable. These multi-chip LEDs are generally constructed with chips of differing wavelengths, so that they can function as a multi-color light source. Examples may be a bi-color LED consisting of a red and green chip, or a full-color LED consisting of a red, a green, and a blue chip. Multi-chip LEDs can also contain several chips of identical wavelength, so that optical power output is increased.

For example, a matrix of multi-chip LEDs can be operated to sense touch in the manner described above, by applying the procedure to only one chip out of each LED. However, having multiple chips per pixel invites a reflective technique that requires fewer steps. This second embodiment of the invention will now be described.

Figure 8:
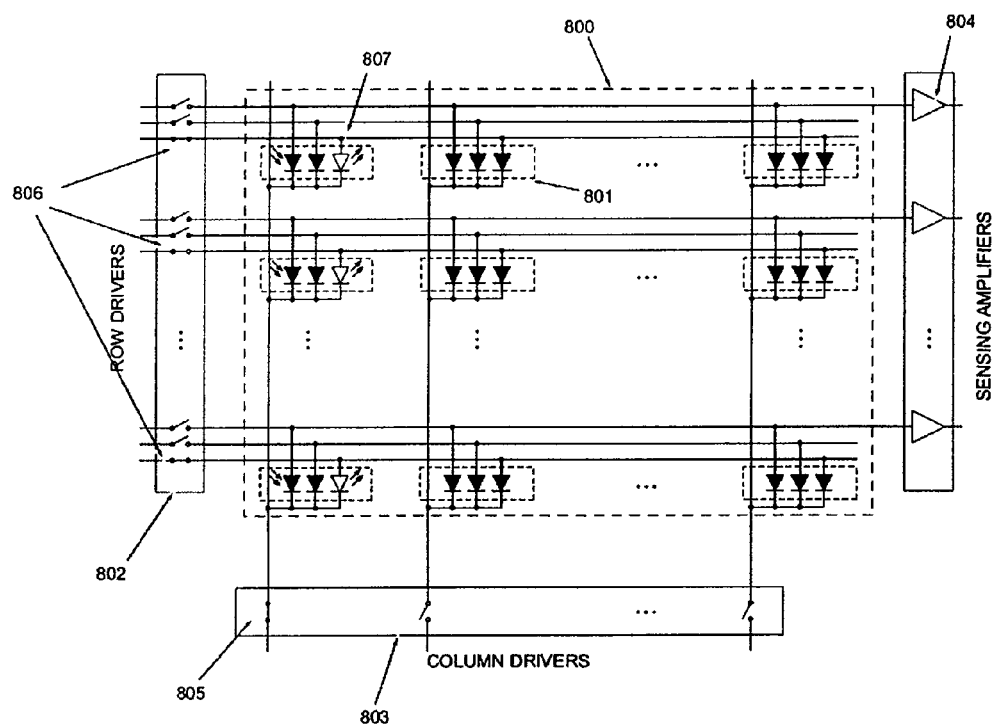
FIG. 8 is a schematic diagram of the apparatus according to one exemplary embodiment of the present invention where the display matrix is composed of multi-chip LEDs.

Referring to FIG. 8, an array of three-chip red-green-blue LEDs 800 may be connected in a matrix row/column configuration 800, which is similar to the configuration of another exemplary embodiment of the present invention shown in FIG. 1. Each LED 801 may have a common cathode, and likely three (3) separate anodes. Instead of a single row-driver for each row, three may be provided, e.g., one for the anode of each red, green, and blue chip 802. The common-cathodes for all the LEDs in a given column may be connected together to sink-drivers 803. Each row may have one row-sense amplifier, which may be attached to the red anode bus of the amplifier 804.

The scanning procedure may be performed sequentially, e.g., one column at a time. A single column-driver may be enabled 805. All blue row-drivers 806 can be enabled, while all red and green row-drivers can be disabled. This causes only the blue chips in the LEDs in the column 807 to act as emitters, and produce light. The red chips may be utilized as detectors through each row's sense-amplifier 804. If a finger is in contact with one of the LEDs in such column, light may be reflected off the finger 700, and be received by the red chips as shown in FIG. 9. After a short delay (e.g., a microsecond) to allow the amplifiers' values to settle, the ADC 106 can perform a conversion for every input channel, and the results may be stored by memory of the controller 106. The blue row-drivers are then disabled, and another set of conversions may be performed without any illumination. The column-driver for the column can then be disabled. The above-described procedure may then be repeated for the next column, until it has been executed on all columns in the matrix. A touch by the finger 700 is registered to be at those pixels where the photometric data is within predetermined range of values.

According to one exemplary experiment in accordance with the present invention, LEDs likely respond as photodetectors significantly to wavelengths similar to or shorter to their own emission wavelength. This result facilitates a choice in color for the emitter and detector chips used in the above procedures. If the LEDs are composed of identical color chips, then the responses are perfectly matched.

This exemplary scanning procedure can be modified so that it is repeated with the green chips in place of the blue chips. This allows for greater accuracy, as both color reflectance measurements can be used together to identify a finger touch. The green rows can also be outfitted with row-sense amplifiers, to allow blue-to-green measurements. In general, every combination of emitter/detector chip pair where the emitter is of a shorter wavelength than that of the detector, can be utilized, so long as the detector color is equipped with a sense-amplifier.

In order for this exemplary embodiment of the apparatus according to the present invention to be able to register contact, the distance between LEDs in the array can be of the same order as the feature size to be detected. LEDs can also be fabricated with, e.g., semiconducting organic compounds, e.g., organic LEDs ("OLEDs"), and they can be manufactured in arrays on sheets in very high pixel densities, both monochrome and multicolor, using simple printing methods. Either embodiment described above is directly suitable for touch-enabling these OLED displays.

Figure 2:
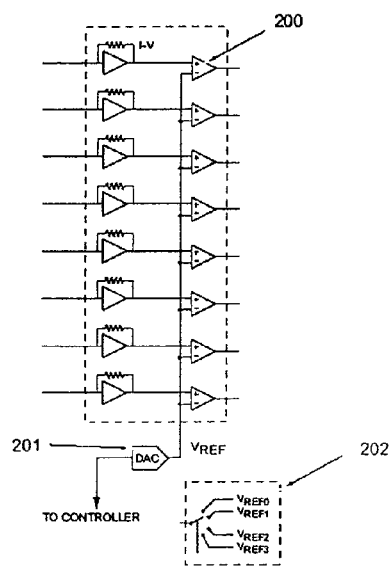
FIG. 2 is a schematic diagram of alternative analog acquisition methods according to an exemplary embodiment of the present invention.

Data acquisition of the output from LEDs used as detectors has been described herein above using a current-voltage converter and ADC. However, this exemplary procedure in accordance with the present invention can be replaced by several other conventional techniques. These include, are not limited to, the use of a current-voltage converter along with a simple voltage comparator 200 as shown in FIG. 2, whose threshold level is dynamically set by a digital-to-analog converter (DAC) 201, or whose threshold level is set by a manually trimmable voltage reference 202. LED photodetectors can also be obtained by taking advantage of the LED's inherent parasitic capacitance, and monitoring the voltage resulting from the discharge of this capacitance, or measuring the time it takes for this voltage to reach a certain threshold.

The exemplary techniques described herein above can also be modified such that the sense-amplifiers are placed on LED anodes columns instead, along with appropriate changes to effect a column-oriented device. This allows operation of the analog circuit components (e.g. transimpedance amplifiers, ADC) without a bipolar power supply.

Figure 11:
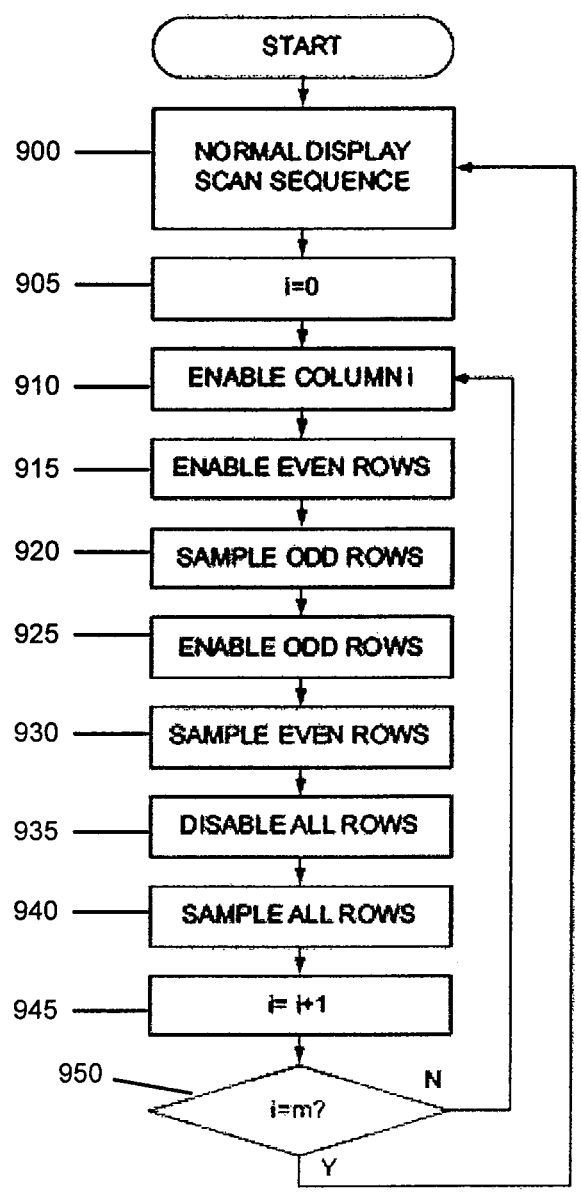
FIG. 11 is a flowchart of an exemplary embodiment of a touch sensing procedure in accordance with the present invention which is performed by the circuit in FIG. 8.

FIG. 11 shows a flow diagram of an exemplary embodiment of a touch sensing procedure in accordance with the present invention which can be performed by the circuit provided in FIG. 8. In particular, a normal display scan sequence can be initiated in step 900. The column count (i) can be set to 0 in step 905. Then, in step 910, the column i is enabled, and in step 915, even rows are enabled. The odd rows are sampled in step 920, and the odd rows are enabled in step 925. Further, in step 930, the even rows are sampled, and then all rows are disabled in step 935. In step 940, all rows are sampled, and in step 945, the column count (i) is increased by 1. In step 950, it is determined whether a predetermined column limit (m) has been reached. If not, the process returns to step 910, and otherwise, the process returns to step 900.

Figure 10:
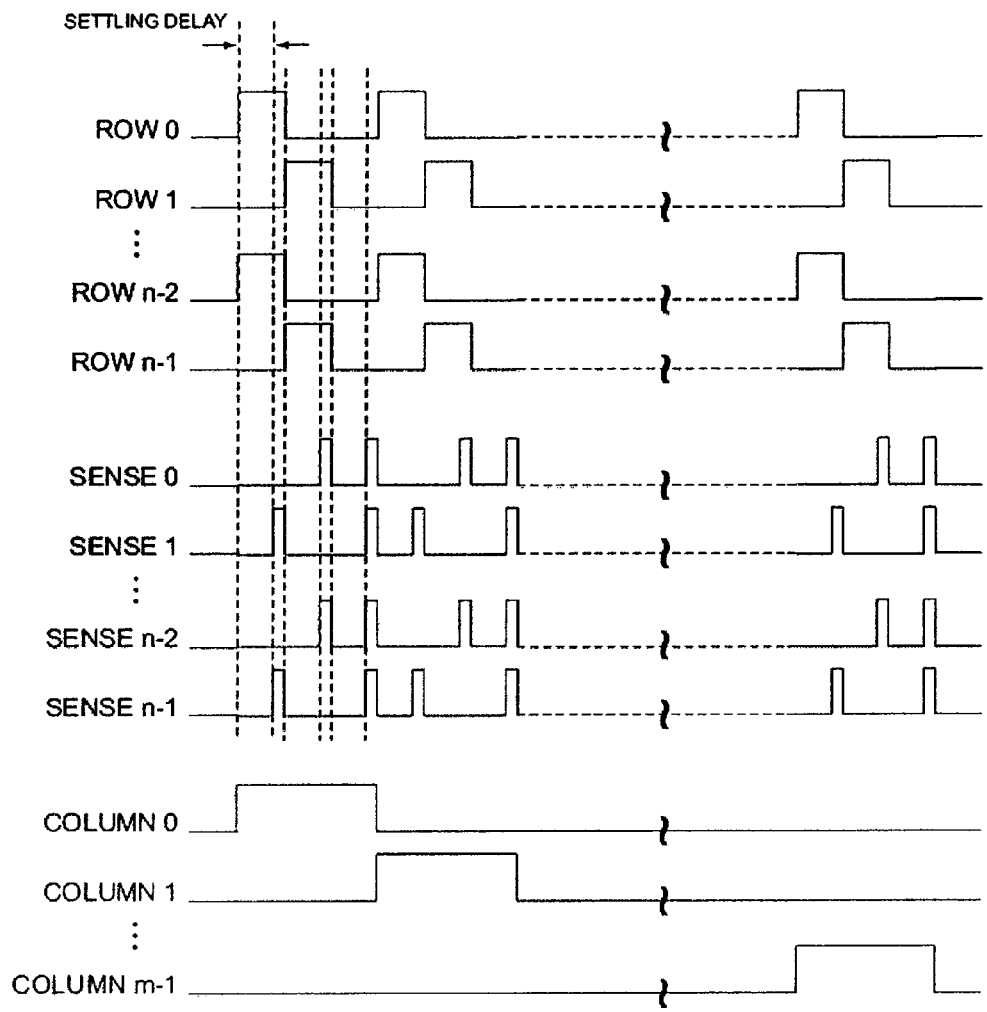
FIG. 10 is a timing diagram illustrating the touch sensing operation of the circuit provided in FIG. 1 in accordance with one exemplary embodiment of the present invention.
Figure 13:
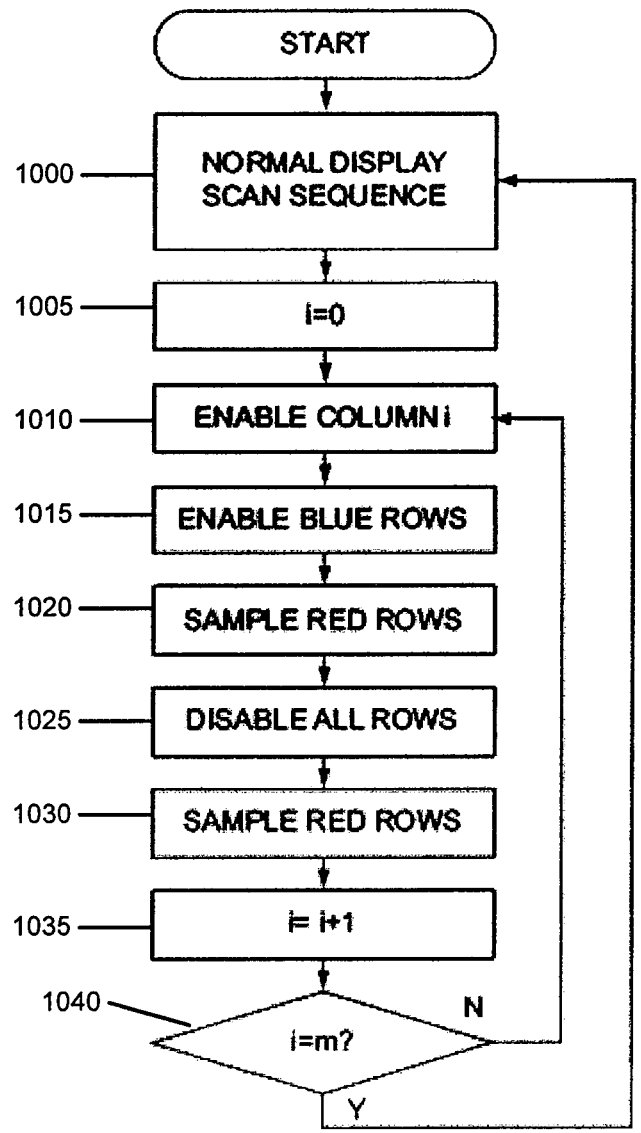
FIG. 13 is a an exemplary flowchart of another exemplary embodiment of the touch sensing procedure in accordance with the present invention which is the circuit in FIG. 8.

FIG. 10 shows a timing diagram of the results provided by the procedure of FIG. 11 providing the results of the touch sensing operation of the circuit in accordance with one exemplary embodiment of the present invention;

FIG. 13 shows a flow diagram of another exemplary embodiment of the touch sensing procedure in accordance with the present invention which can be performed by the circuit provided in FIG. 8. In particular, a normal display scan sequence can be initiated in step 1000. The column count (i) can be set to 0 in step 1005. Then, in step 1010, the column i is enabled, and in step 1015, blue rows are enabled. The red rows are sampled in step 1020, and then all rows are disabled in step 1025. In step 1030, red rows are sampled, and instep 1035, the column count (i) is increased by 1. In step 1040, it is determined whether a predetermined column limit (m) has been reached. If not, the process returns to step 1010, and otherwise, the process returns to step 1000.

Figure 12:
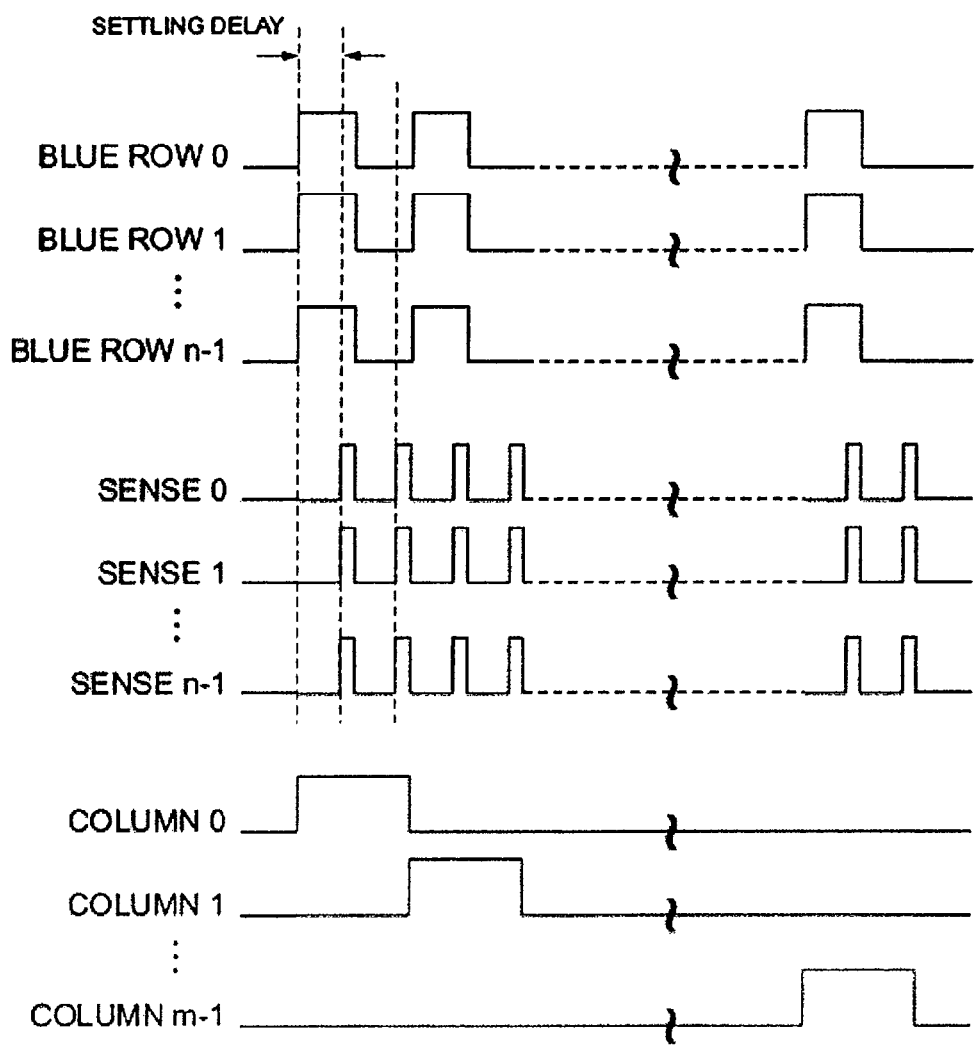
FIG. 12 is a timing diagram illustrating the touch sensing operation of the circuit provided in FIG. 1 in accordance with another exemplary embodiment of the present invention.

FIG. 12 shows a timing diagram of the results provided by the procedure of FIG. 13 providing the results of the touch sensing operation of the circuit in accordance with one exemplary embodiment of the present invention;

The foregoing merely illustrates the principles of the invention. Various modifications and alterations to the described embodiments will be apparent to those skilled in the art in view of the teachings herein. It will thus be appreciated that those skilled in the art will be able to devise numerous systems and methods which, although not explicitly shown or described herein, embody the principles of the invention and are thus within the spirit and scope of the invention. All publications and patents cited above are incorporated herein by reference in their entireties.

What is claimed is:

1. A method for multi-touch sensing, comprising:
generating at least one image on a screen using a plurality of light emitting diodes (LEDs) so as to provide a visible light;
receiving photometric first information from at least one of the plurality of LEDs based on at least two conditions, wherein at least one other of the plurality of LEDs is configured to emit the visible light such that the visible light is at least one of reflected or scattered back so as to be detected by the at least one of the plurality of LEDs, and wherein the reflected or scattered-back light is used to generate the photometric first information; and
determining second information as a function of the photometric first information based on at least one predetermined range of values associated with at least one of the conditions.

2. The method of claim 1, wherein the conditions comprise (i) the at least one other of the plurality of LEDs is lit and (ii) the at least one of the LEDs is not lit.

3. The method of claim 1, wherein at least one of the at least one of the plurality of LEDs or the at least one other of the LEDs is an organic LED.

4. The method of claim 1, wherein at least one of the at least one of the LEDs or the at least one other of the LEDs is an individually addressable multi-chip LED.

5. An apparatus for determining information from at least one of a plurality of light emitting diodes (LEDs), comprising:
a computer arrangement configured to (a) generate at least one image on a screen using at least one of the plurality of LEDs so as to provide a visible light, and (b) receive first information from at least one other of the plurality of LEDs based on at least two conditions, wherein the at least one of the LEDs is configured to emit the visible light such that the visible light is at least one of reflected or scattered back so as to be detected by the at least one other of the plurality of LEDs, and wherein the reflected or scattered-back light is used to generate the first information, wherein the computer arrangement is further configured to determine second information based on (i) the first information and (ii) a predetermined criteria for at least one of the conditions.

6. The apparatus of claim 5, wherein the first information is associated with a detection of light.

7. The apparatus of claim 5, wherein the predetermined criteria for at least one of the conditions is based on the first information comprising at least one value that is within a predetermined range of values.

8. The apparatus of claim 5, wherein the computer arrangement is configured to determine third information associated with at least one touch and based on the second information.

9. The apparatus of claim 8, wherein a plurality of the at least one touch is detected by a detection arrangement, and each one of the plurality of the at least one touch is associated with a different one of the LEDs.

10. The apparatus of claim 9, wherein:
the first information relates to a detection of an increase in light;
the predetermined criteria for at least one of the conditions relates to the first information comprising at least one value that is within a predetermined range of values;
the second information relates to an object being approximately adjacent to the at least one of the plurality of LEDs; and
the at least two conditions comprise (i) the at least one of the LEDs is lit, and (ii) the at least one other of the LEDs is not lit.

11. The apparatus of claim 5 wherein the two conditions comprise (i) the at least one of the LEDs is lit and (ii) the at least one other of the LEDs is not lit.

12. An apparatus for controlling a plurality of LEDs, comprising a computer arrangement configured to (i) generate at least one image on a screen using the plurality of LEDs, (ii) interchange an emitter function and a detector function associated with at least one of the plurality of LEDs, and (iii) determine information associated with at least one touch based on light received by the at least one of the plurality of LEDs while performing the detector function.

13. The apparatus of claim 12, wherein the emitter function causes a production of visible light.

14. The apparatus of claim 12, wherein the detector function facilitates a measurement of light.

15. The apparatus of claim 12, further comprising at least one sense amplifier associated with the detector function.

16. The apparatus of claim 12, further comprising at least one of (i) a column driver or (ii) a row driver associated with the emitter function.

17. The apparatus of claim 12, wherein the detector function includes a detection of the light based on at least one of at least two conditions.

18. The apparatus of claim 17, wherein the conditions comprise (i) the at least one of the LEDs is lit and (ii) at least one other of the LEDs is unlit.

19. The apparatus of claim 12, wherein the information is associated with a plurality of touches.

20. The apparatus of claim 17, further comprising:
at least one sense amplifier; and
at least one of (i) a column driver or (ii) a row driver associated with the emitter function, wherein the emitter function includes a production of visible light, and the detector function includes a measurement of the light.

21. A method for controlling a plurality of light emitting diodes (LEDs), comprising:
generating at least one image on a screen using the plurality of LEDs;
interchanging an emitter function and a detector function associated with at least one of the plurality of LEDs; and
determining information associated with at least one touch based on light received by the at least one of the plurality of LEDs while performing the detector function.

22. The method of claim 21, wherein the detector function includes the detection of the light based on at least one of at least two conditions.

23. The method of claim 22, wherein the conditions comprise (i) the at least one of the plurality of LEDs is lit and (ii) at least one other of the plurality of LEDs is unlit.

24. The method of claim 21, wherein the at least one touch comprises a plurality of touches.

25. The method of claim 21, wherein the emitter function includes the causation of the at least one of the plurality of LEDs to emit light, the detector function includes the detection of light from at least one other of the plurality of LEDs, and the light is at least one of reflected or scattered back from the at least one of the plurality of LEDs.

26. A method for controlling at least two light emitting diodes (LEDs), comprising:
generating at least one image on a screen using a first LED of the at least two LEDs and a second LED of the at least two LEDs;
emitting light from the first LED of the LEDs;
detecting the light by the second LED; and
determining first photometric information based on data associated with the second LED detecting the light, wherein the light is at least one of reflected or scattered back after being emitted from the first LED.

27. The method of claim 26, wherein the second LED is not lit, and second photometric information is determined based on the second LED.

28. The method of claim 27, further comprising determining at least one touch based on the first photometric information and the second photometric information.

29. An apparatus for controlling at least two light emitting diodes (LEDs), comprising:
an arrangement including a computer that is configured to (i) generate at least one image on a screen using light from a first LED of the at least two LEDs and a second LED of the at least two LEDs, (ii) control an emission of light from the first LED, and (iii) determine first photometric information based on the second LED detecting light that is at least one of reflected or scattered back after being emitted from the first LED.

30. The apparatus of claim 29, wherein the arrangement is further configured to determine second photometric information based on the second LED being unlit.

31. The apparatus of claim 30, wherein the arrangement is further configured to determine at least one touch based on the first photometric information and the second photometric information.

32. The apparatus of claim 29, wherein the arrangement comprises at least one sense amplifier and at least one of (i) a column driver or (ii) a row driver.

33. The method of claim 1, wherein the photometric first information is based on a quantity of light, and determining second information is based on an increase in light.

34. The apparatus of claim 5, wherein the first information is based on a quantity of light, and the determination of the second information is based on an increase in the quantity of the light.

35. The apparatus of claim 12, wherein the screen is oriented in a plane, and wherein the plurality of LEDs are configured to emit light in a direction which is approximately perpendicular to the plane.

36. The apparatus of claim 12, wherein the computer arrangement is further configured to detect the object being approximately adjacent to the at least one of the plurality of LEDs based on an increase in a detected light.

37. The apparatus of claim 12, wherein the plurality of LEDs are configured such that light originating from an emitting one of the plurality of LEDs, that operates with the emitter function, reflects or scatters objects that are approximately adjacent to the at least one of the plurality of LEDs, thereby causing an increase of light on the at least one of the plurality of LEDs, and wherein the at least one of the plurality of LEDs, when operating with the detector function, detects the increase of the light.

38. The apparatus of claim 12, wherein the at least one of the plurality of LEDs is configured to, when operating with the detector function, detect or determine how close an object is adjacent thereto based on an increase in light.

39. The apparatus of claim 12, further comprising a controller configured to cause the plurality of LEDs to generate the at least one image.

40. The method of claim 21, further comprising:
detecting an object only when the object is approximately adjacent to the at least one of the plurality of LEDs.

41. The method of claim 40, wherein detection of the object is based on an increase of a detected light by the at least one of the plurality of LEDs.

42. The method of claim 26, wherein the data associated with the second LED includes an increase of the received light.

43. The method of claim 26, further comprising:
interchanging functions of the first LED and the second LED, including:
illuminating the second LED to emit light;
receiving the light by the first LED; and
determining second photometric information based on data associated with the first LED that receives the light.

44. The apparatus of claim 29, wherein the screen is oriented in a plane, and wherein the first LED and the second LED are each configured to emit the light in a direction which is approximately perpendicular to the plane.

45. An apparatus for determining multiple touches with a plurality of light emitting diodes (LEDs), comprising:
a computer configured to generating at least one image on a screen which extends along a first plane, wherein the plurality of LEDs are arranged in a matrix having at least two dimensions;
a controller configured to, for at least a particular one of the LEDs of the plurality of LEDs:
(i) cause an illumination by the at least particular one of the LEDs so as to emit light along a second plane that is substantially perpendicular to the first plane;
(ii) terminate the illumination of the light from the at least particular one of the LEDs;
(iii) detect the light with the at least particular one of the LEDs while not emitting light;
(iv) identify an object based on an increase in detected light.

46. The apparatus of claim 45, wherein the controller is further configured to identify a plurality of touches as a plurality of objects based on an increase in a detected light at a plurality of individual ones of the LEDs, at least two of which being not adjacent to each other.

47. The apparatus of claim 45, wherein the controller is configured to execute procedures (i) to (iv) repeatedly for each of the plurality of LEDs.

48. The apparatus of claim 12, wherein the first arrangement is configured to interchange the emitter function and the detector function associated with at least one other of the plurality of LEDs.

49. The method of claim 21, wherein the interchanging is performed between the emitter function and the detector function which are performed by the at least one of the LEDs.

50. The method of claim 1, wherein the plurality of LEDs emit a light of a wavelength that does not appreciably penetrate a finger.

51. The method of claim 1, wherein the plurality of LEDs are arranged with at most approximately a 6 millimeter (mm) pitch-packing.

52. The apparatus of claim 5, wherein the screen is oriented in a plane, and wherein the plurality of LEDs are configured to provide the visible light in a direction that is approximately perpendicular to the plane such that the at least one image is generated on the screen.

53. The apparatus of claim 5, wherein the plurality of LEDs are arranged with at most approximately a 6 mm pitch-packing.

54. The apparatus of claim 12, wherein the plurality of LEDs are configured to emit a light of a wavelength that does not appreciably penetrate a finger.

55. The apparatus of claim 12, wherein the plurality of LEDs are arranged with at most approximately a 6 mm pitch-packing.

56. The method of claim 21, wherein the plurality of LEDs are configured to emit a light of a wavelength that does not appreciably penetrate a finger.

57. The method of claim 21, wherein the plurality of LEDs are arranged with at most approximately a 6 mm pitch-packing.

58. An apparatus for detecting light, comprising:
a plurality of light emitting diodes (LEDs),
wherein at least one first LED Of the plurality of LEDs is configured to provide a first light in a first direction toward a screen that extends along a plane, wherein the first direction is perpendicular to the plane, and wherein at least one second LED of the plurality of LEDs is configured to receive or detect a second light which is a reflection or a scattering of the first light.

59. The apparatus of claim 58, wherein the at least one first LED causes a generation of at least one image on the screen.

* * * * *